United States Patent [19]

Hong et al.

[11] Patent Number: 5,457,061

[45] Date of Patent: Oct. 10, 1995

[54] METHOD OF MAKING TOP FLOATING-GATE FLASH EEPROM STRUCTURE

[75] Inventors: Gary Hong; Chen-Chiu Hsue, both of Hsin-Chu, Taiwan

[73] Assignee: United Microelectronics Corporation, Hsinchu, Taiwan

[21] Appl. No.: 275,269

[22] Filed: Jul. 15, 1994

[51] Int. Cl.[6] .................... H01L 21/8247; H01L 21/266
[52] U.S. Cl. .............................. 437/43; 437/52; 437/978
[58] Field of Search ................................. 437/43, 48, 52, 437/978; 257/315, 316

[56] References Cited

U.S. PATENT DOCUMENTS

| | | | |
|---|---|---|---|
| 4,868,629 | 9/1989 | Eitan | 365/185 |
| 5,045,488 | 9/1991 | Yeh | 437/43 |
| 5,049,515 | 9/1991 | Tzeng | 437/43 |
| 5,061,654 | 10/1991 | Shimizu et al. | 437/70 |
| 5,284,786 | 2/1994 | Sethi | 437/43 |
| 5,293,328 | 3/1994 | Amin et al. | 365/185 |

Primary Examiner—Olik Chaudhuri
Assistant Examiner—Richard A. Booth
Attorney, Agent, or Firm—George O. Saile; Stephen B. Ackerman

[57] ABSTRACT

A method for forming, and a resultant structure of, a top floating gate FLASH EEPROM cell are described. There is a first insulating structure over a silicon substrate, whereby the first insulating structure is a gate oxide. A first conductive structure is formed over the first insulating structure, whereby the first conductive structure is a control gate. There is a first insulating layer over the surfaces of the first conductive structure, whereby the first insulating layer is an interpoly dielectric. There is a second conductive structure formed over the first insulating layer and over a portion of the silicon substrate adjacent to the first insulating structure, whereby the second conductive structure is a floating gate. A second insulating layer is formed between the silicon substrate and the second conductive structure, whereby the second insulating layer is a tunnel oxide. Active regions in the silicon substrate, implanted with a conductivity-imparting dopant, are formed under the second insulating layer but are horizontally a distance from the first insulating structure.

9 Claims, 4 Drawing Sheets

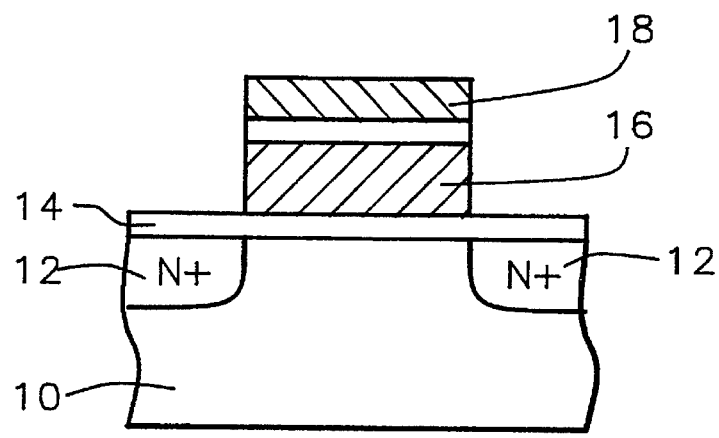
FIG. 1 – Prior Art
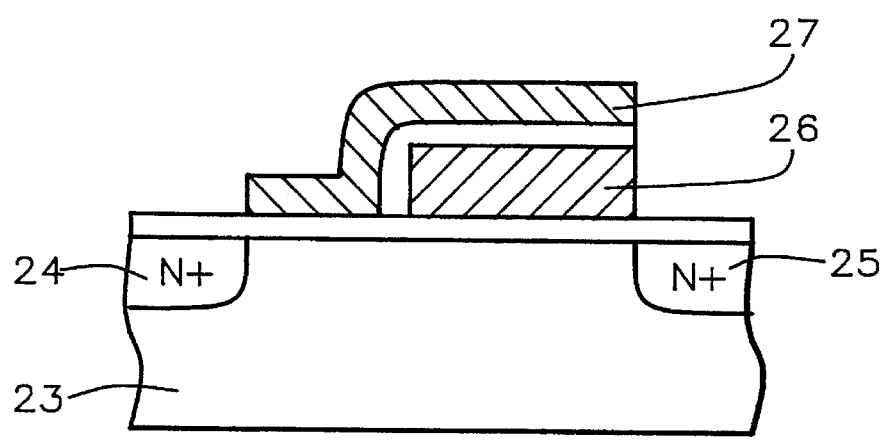
FIG. 2 – Prior Art 5,457,061

METHOD OF MAKING TOP FLOATING-GATE FLASH EEPROM STRUCTURE

BACKGROUND OF THE INVENTION (1) Field of the Invention

This invention relates to a Read Only Memory (ROM) semiconductor device, and more particularly to a structure and method of manufacturing a top floating gate flash EEPROM (Electrically Erasable Programmable Read Only Memory).

(2) Description of the Related Art

ROM devices are well known and widely used in the computer technology. In general, a ROM device consists of an array of MOSFETs (Metal Oxide Semiconductor Field Effect Transistor) arranged in columns and rows where selected MOSFETs are rendered permanently conductive, or non-conductive, depending on the type of transistor. The ability to set the conductive state of each MOSFET provides a means for storing binary information, and is done typically during a manufacturing process. In a ROM device, this information is non-volatile, i.e., it is maintained even when power is removed from the circuit.

EPROM devices differ from ROMs in their ability to be programmed and erased by a user, after the manufacturing process is complete. They offer advantages such as a small single-cell structure, made of a single MOS transistor with a double-polysilicon gate, and thus high density. Programming is typically accomplished by channel hot-electron injection, outside of the circuit in which the EPROM is used, and erasing by exposure to ultraviolet light, or other means. These somewhat cumbersome techniques explain the popularity of EEPROMs (Electrically Erasable Programmable Read Only Memory), which can be erased and programmed while in-circuit, using Fowler-Nordheim tunneling. However, EEPROMs have a large cell size and require two transistors per cell.

An EEPROM uses a floating gate structure in the MOSFET cell to provide programmability. The floating, or unconnected, gate provides a conductive surface isolated from the source and drain regions of the MOSFET by a thin gate oxide. A second conductive gate, called the control gate, is adjacent to but isolated from the floating gate. The threshold voltage characteristics of the MOSFET cell is controlled by the amount of charge on the floating gate. The amount of charge is set to one of two levels, to indicate whether the cell has been programmed "on" or "off".

The memory cell's state is "read" by applying appropriate voltages to the MOSFET source and drain, and to the control gate, and then sensing the amount of current flow through the transistor. The desired memory cell is selected by choosing the source and drain lines in the column where the cell is located, and applying the control gate voltage to the control gates in the row of the cell being addressed.

The memory cell's programmable state may be erased by removing charge from the floating gate. A fairly recent technology is "Flash" memories, in which the entire array of memory cells, or a significant subset thereof, is erased simultaneously. A conventional Flash memory cell is shown in FIG. 1, in which a control gate 18 has been formed directly over floating gate 16, which electrical charge is applied or removed through tunnel oxide 14 by channel-hot-electron or Fowler-Nordheim tunneling by way of source/drain regions 12, in a substrate 10.

A known problem with the EEPROM is that of "over-erasing", in which positive charge remains on the floating gate after an erase. One solution is the split-gate structure of FIG. 2, which solves the over-erase problem but at the expense of a larger cell size. Source 24 and drain 25 regions are self-aligned in a substrate 23 with the edges of floating-gate 26 and isolation gate 27, respectively. An example is shown in U.S. Pat. No. 4,868,629 (Eitan). Eitan teaches the use of a photoresist pattern to cover part of the floating gate area and the channel region of the "isolation transistor" (which is connected in series with the floating-gate transistor), during source/drain implant.

A problem with this split-gate Flash cell structure is that all programs and erase operations take place through the drain, leading to reliability problems and the charge trapping effect. Only the drain junction is underneath the floating gate, and therefore program and erase operations can only be performed through the drain junction. Usually the erase operation causes electron trapping in the tunnel oxide near the drain, which results in less electric field for the program operation, and thus reliability degradation. If the program and erase operations were performed separately, one each through the source and drain areas, the program/erase (endurance) cycles would be improved.

SUMMARY OF THE INVENTION

It is therefore an object of the invention to provide a top floating gate FLASH EEPROM cell with improved reliability.

It is a further object of the invention to provide a a method of manufacturing a top floating gate FLASH EEPROM cell.

These objects are achieved by a top floating gate Flash EEPROM, in which there is a first insulating structure over a silicon substrate, whereby the first insulating structure is a gate oxide. A first conductive structure is over the first insulating structure, whereby the first conductive structure is a control gate. There is a first insulating layer over vertical and horizontal surfaces of the first conductive structure and over vertical surfaces of the first insulating structure, whereby the first insulating layer is an interpoly dielectric. There is a second conductive structure over the first insulating layer and over a portion of the silicon substrate adjacent to the first insulating structure, whereby the second conductive structure is a floating gate. A second insulating layer is between the silicon substrate and the second conductive structure, whereby the second insulating layer is a tunnel oxide. Active regions in the silicon substrate, implanted with a conductivity-imparting dopant, are under the second insulating layer but are horizontally a distance from the first insulating structure.

These objects are further achieved by a method of manufacturing a top floating gate flash EEPROM cell, in which a first insulating layer is formed over a silicon substrate. A first conductive layer is formed over the first insulating layer. A second insulating layer is formed over the first conductive layer. The second insulating layer and the first conductive layer are patterned to form a conductive line. A third insulating layer is formed on the vertical surfaces of the conductive line. The first insulating layer is removed in the region not masked by the conductive line. A fourth insulating layer is formed in the region not masked by the conductive line. A second conductive layer is formed over the conductive line, the third insulating layer and the fourth insulating layer. The second conductive layer is patterned to form a floating gate over vertical and horizontal surfaces of the conductive line, and over a portion of the fourth insulating layer adjacent to the conductive line. Active regions are formed in the silicon substrate in the area not masked by the floating gate.

BRIEF DESCRIPTION OF THE DRAWINGS

FIGS. 1 and 2 are cross-sectional representations of two prior art structures for Flash EEPROMs.

FIG. 6 is taken along line 6—6 of FIG. 7.

DESCRIPTION OF THE PREFERRED EMBODIMENTS

Figure 3:
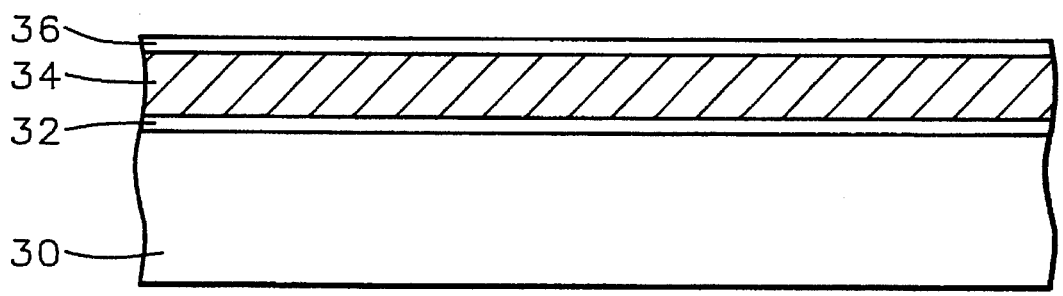
FIGS. 3 to 6 are cross-sectional representations of the invention for a top floating gate Flash EEPROM, where

Referring now to the drawings, more particularly to FIGS. 3 through 8, there is illustrated a method and resulting structure for the novel process for producing a top floating gate EEPROM. Referring more particularly to FIG. 3, there is illustrated a silicon substrate 30 which has been p-doped with the dopant concentration being between about 1 E 14 and 5 E 15 atoms/cm.$^3$. An oxide layer 32 is formed to provide a gate oxide, by thermal oxidation at a temperature of between about 800° and 1000° C. for between about 10 and 30 minutes, in an atmosphere of $O_2/N_2$ (oxygen/nitrogen). This results in the formation of a gate oxide with a thickness of between about 150 and 400 Angstroms.

A deposition of polycrystalline silicon 34, or polysilicon, is now performed to a thickness of between about 1000 and 5000 Angstroms, by LPCVD (Low Pressure Chemical Vapor Deposition). The resistivity of the polysilicon layer is reduced by doping with phosphorus P31, or arsenic AS75, at a concentration of between about 1 E 14 and 5 E 15 atoms/cm.$^2$ and at an energy of between about 30 and 60 KeV.

An interpoly oxide 36 is now formed on polysilicon layer 34. This may be a single oxide layer but is preferably ONO—a three-layer sandwich structure of silicon oxide ($SiO_2$), silicon nitride ($Si_3N_4$) and silicon oxide ($SiO_2$). The first $SiO_2$ layer is formed by thermal oxidation to a thickness of between about 60 and 150 Angstroms. The $Si_3N_4$ layer is deposited by LPCVD to a thickness of between about 80 and 200 Angstroms. The final $SiO_2$ layer is formed by thermal oxidation, or CVD, to a thickness of between about 20 and 80 Angstroms. The total interpoly oxide thickness is between about 120 and 300 Angstroms.

Figure 4:
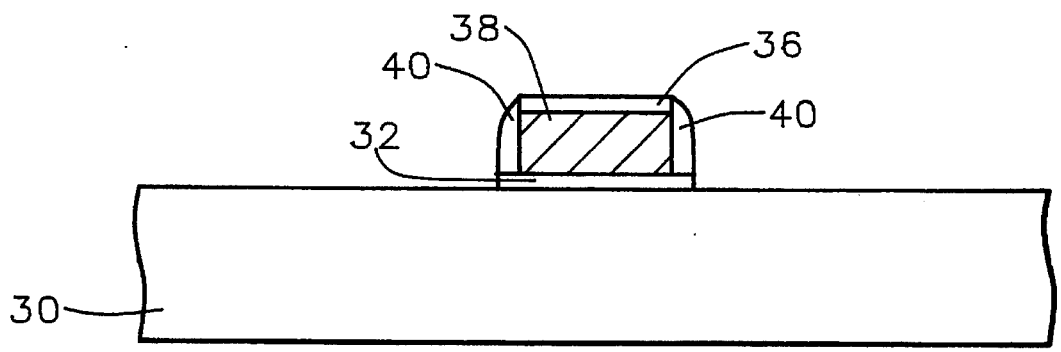
Figure 5:
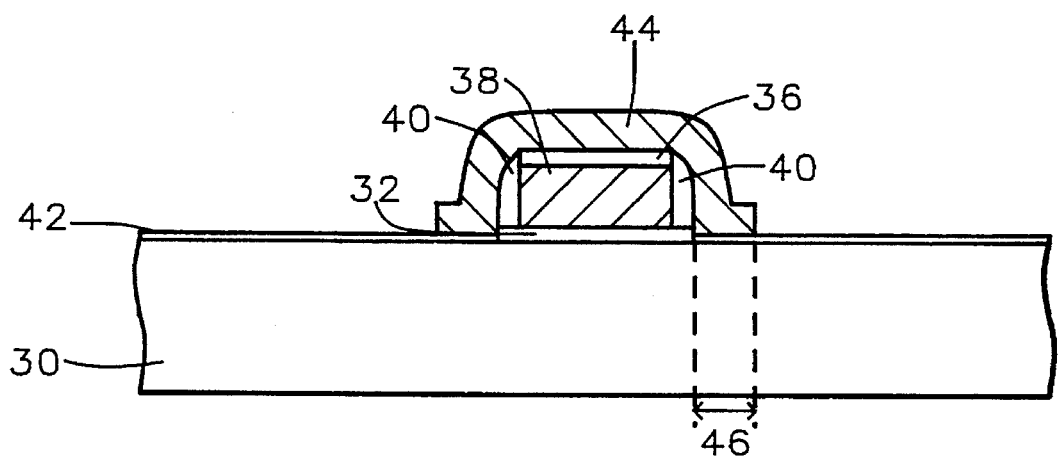

Referring now to FIG. 4, the first polysilicon layer 34 is patterned, by conventional lithography and etching, to form word lines 38 for the Flash EEPROM. Word lines are formed as parallel conductive strips (running into and out of the cross-sectional drawing of FIG. 4), and will connect a column of memory cells, with the word line acting as a control gate at each memory cell location. This is in contrast to the prior art Flash EEPROM structures of FIGS. 1 and 2 in which the control gate is formed over the floating gate. Etching of the ONO layer 36 and polysilicon 34 is accomplished by dry etching. The gate oxide is not etched.

To form an interpoly dielectric on the vertical surfaces of the word lines 38, a single insulating layer 40 could be formed, as shown in FIG. 4, but it is preferred to form an oxide/nitride dielectric. A thin oxidation is performed, thermally at a temperature of between about 800° and 1000°C. and for between about 10 and 50 minutes, to form an $SiO_2$ layer with a thickness of between about 60 and 200 Angstroms. This is followed by a nitride deposition and etch, in which $Si_3N_4$ is deposited by LPCVD, to a thickness of between about 100 and 300 Angstroms, and etched anisotropically to leave $Si_3N_4$ only on the vertical surfaces of the word lines.

Also as seen in FIG. 4, the gate oxide is etched, using the word line 38 and spacers 40 as a mask, by etching in buffered hydrofluoric acid for between about 1 and 3 minutes, so that the gate oxide remains only under the word lines 38.

During the gate oxide etch, the top oxide layer of ONO layer 36 is etched away. However, with reference now to FIG. 5, the ONO top oxide is re-grown at the same time as the formation of a thin oxide 42, by thermally oxidizing at a temperature of between about 800° and 1000° C. for between about 10 and 50 minutes, in an atmosphere of $O_2/N_2$ or $O_2/N_2/H_2$. A thin oxide is formed at the same time on the surface of layer 40. The thermal oxidation results in a tunnel oxide layer 42 with a thickness of between about 60 and 120 Angstroms, which will be used as the tunnel oxide for the Flash EEPROM memory cell program, read and erase operations.

A conformal deposition of polysilicon is now performed to a thickness of between about 1000 and 5000 Angstroms, by LPCVD. The resistivity of the polysilicon layer is reduced by ion implantation of arsenic or phosphorus, or by in-situ doping with phosphorus oxychloride ($POCl_3$). The floating gate 44 of the Flash cell is then formed by conventional lithography and etching of the polysilicon. The portion of the floating gate in contact with the tunnel oxide has a length 46 of between about 0.2 and 0.8 micrometers.

Figure 6:
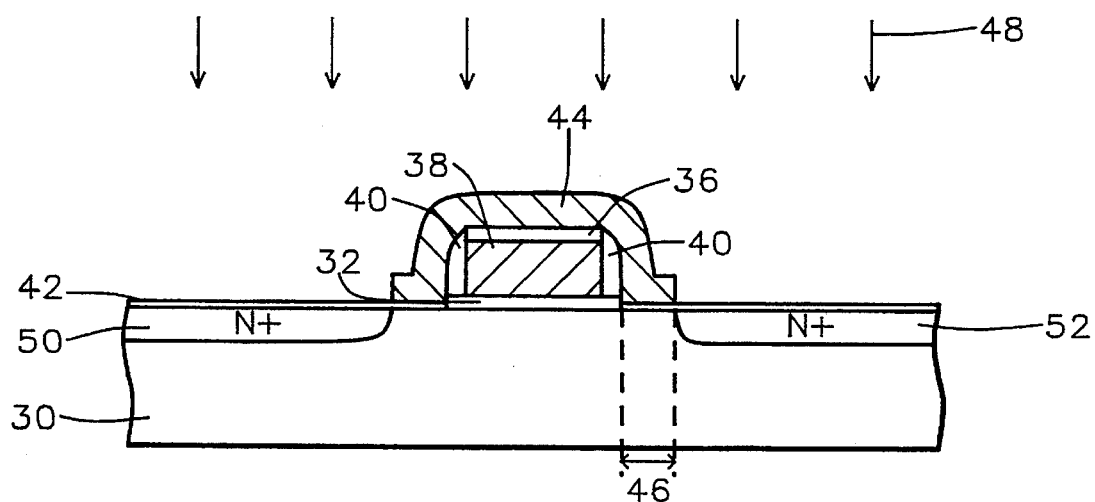

Referring now to FIG. 6, the memory cell source regions 50 and drain regions 52 are formed by ion implantation 48 of arsenic AS75 at an energy of between about 40 and 100 KeV, and a dosage of between about 1 E 15 and 8 E 15 atoms/cm.$^2$. Completion of the Flash EEPROM device now proceeds as is well known in the art (not shown). A layer of borophosphosilicate glass (BPSG) is deposited and reflowed to planarize its top surface, contacts are formed, and metallization and passivation steps are carried out. During BPSG reflow, the ion-implanted dopant in the N+ regions 50 and 52 would be driven in.

Figure 7:
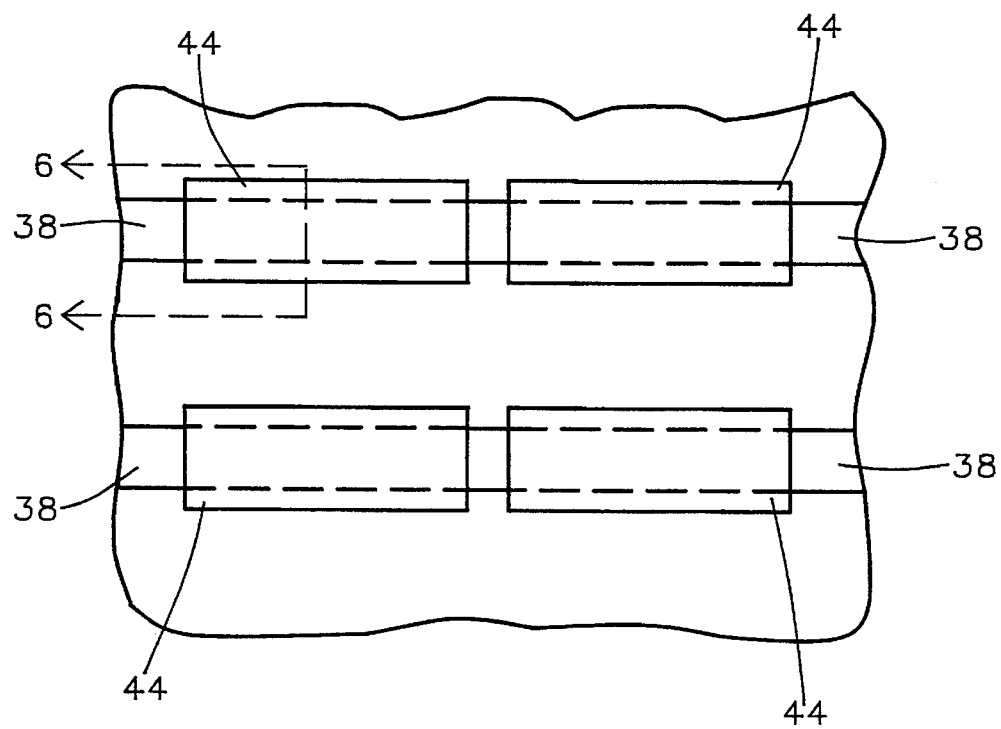
FIG. 7 is a top view of the invention for a top floating gate Flash EEPROM.
Figure 8:
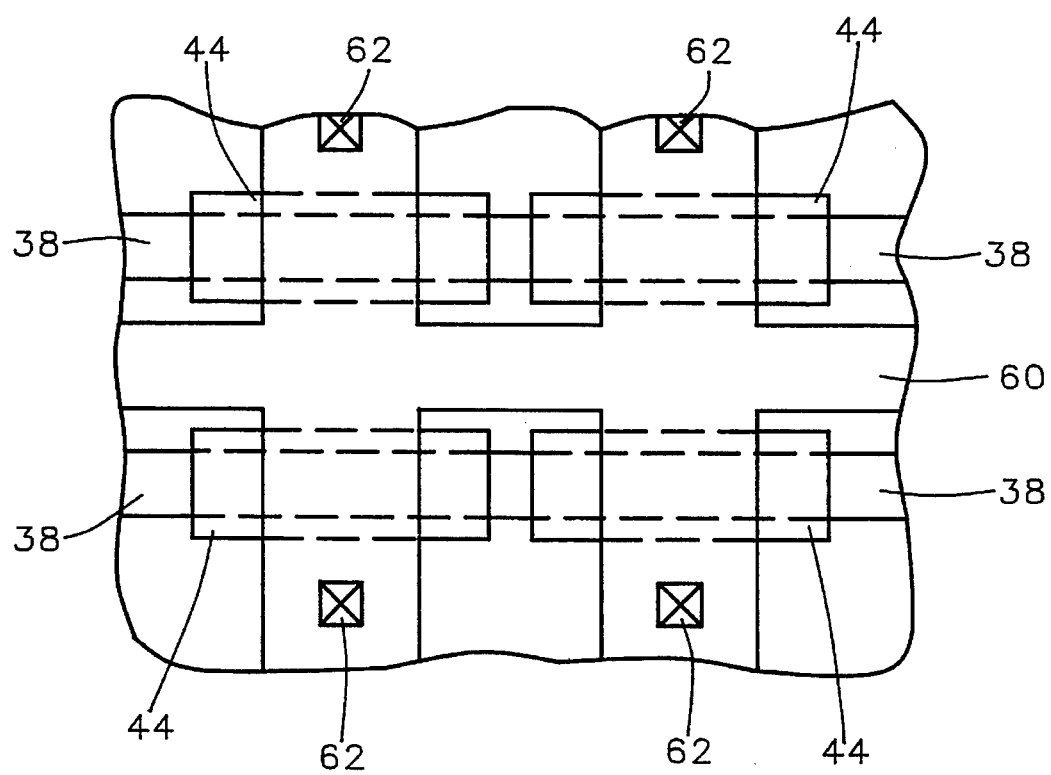
FIG. 8 is a top view of the invention for a top floating gate Flash EEPROM, in which metallization and contacts are also shown.

FIGS. 7 and 8 are top views of a portion of an array of the top floating-gate Flash EEPROM cells of the invention. The FIG. 6 cross-section is taken along view 6—6 of FIG. 7, before the metallization 60 in FIG. 8 has been added. Shown in FIGS. 7 and 8 are the first polysilicon word lines 38, and the second polysilicon floating gates 44. Metallization 60 and contacts 62 are also shown.

Operation of the EPROM is indicated in Table I below, in which the voltages to be applied at the control gate, drain and source, respectively, are shown.

TABLE I

| Operation | Control gate (W/L) | Drain | Source |
|---|---|---|---|
| Program | $V_{PP}$ | 0 | floating |
| Erase | 0 | floating | $V_{PP}$ |
| Read | 3 V | 1 V | 0 |

$V_{PP}$ = 10 to 20 volts

To program the EPROM, that is, to set the charge on the floating gate to an "on" level a voltage level of 10 to 20 V (volts), noted as $V_{pp}$, is applied to the word line/control gate of the memory cell that is desired to be programmed. A level of 0 volts is applied to the memory cell drain, and the source is left to float, that is, with no voltage applied.

To erase the cell contents, a level of 0 V is applied to the word line/control gate, the drain is left to float, and $V_{pp}$ is applied to the source. For a read operation, voltages of 1 V are applied at the word line/control gate and at the drain, and 0 V at the source.

It is seen that the source and drain are left floating during program and erase operations, respectively, which leads to the improved reliability of the Flash EEPROM of the invention, over those prior art split-gate structures in which all program and erase operations are done through the drain junction.

While the invention has been particularly shown and described with reference to the preferred embodiments thereof, it will be understood by those skilled in the art that various changes in form and details may be made without departing from the spirit and scope of the invention.

What is claimed is:

1. A method of forming a top floating gate flash EEPROM cell, comprising the steps of:

forming a first insulating layer over a silicon substrate;

forming a first conductive layer over said first insulating layer;

forming a top interpoly dielectric of oxide/nitride/oxide over said first conductive layer;

patterning said top interpoly dielectric and said first conductive layer to form a conductive line;

forming a side interpoly dielectric of oxide/nitride on the vertical surfaces of said conductive line;

removing said first insulating layer in the region not masked by said conductive line, and simultaneously removing the top oxide of said top interpoly dielectric;

forming an oxide insulating layer over said silicon substrate, in the region not masked by said conductive line, and over said top and side interpoly dielectrics, whereby said top and side interpoly dielectrics have an oxide/nitride/oxide structure, and whereby said oxide insulating layer forms a tunnel oxide for said EEPROM cell;

forming a second conductive layer over said conductive line, said side interpoly dielectric and said top interpoly dielectric;

patterning said second conductive layer to form a floating gate over vertical and horizontal surfaces of said conductive line, and over a portion of said tunnel oxide adjacent to said conductive line; and forming active regions in said silicon substrate in the area not masked by said floating gate.

2. The method of claim 1 wherein said first insulating layer is formed to a thickness of between about 150 to 400 Angstroms, by thermal oxidation at a temperature of between about 800° to 1000° C. between about 10 to 30 minutes.

3. The method of claim 1, wherein said first conductive layer is formed of doped polycrystalline silicon at a thickness of between about 1000 to 5000 Angstroms.

4. The method of claim 1, wherein said forming a top interpoly dielectric comprises the steps of:

forming a first layer of silicon oxide, over said first insulating layer, to a thickness of between about 60 to 150 Angstroms;

forming a layer of silicon nitride, over said first layer of silicon oxide, to a thickness of between about 80 to 200 Angstroms; and forming a second layer of silicon oxide, over said layer of silicon nitride, to a thickness of between about 20 to 80 Angstroms.

5. The method of claim 1 wherein said forming a side interpoly dielectric comprises the steps of:

forming a layer of silicon oxide, over said conductive line, to a thickness of between about 60 to 200 Angstroms;

forming a layer of silicon nitride, over said layer of silicon oxide, to a thickness of between about 100 to 300 Angstroms; and anisotropically etching said layers of silicon oxide and silicon nitride to form said side interpoly dielectric.

6. The method of claim 1 wherein said oxide insulating layer is formed to a thickness of between about 60 to 120 Angstroms, by thermal oxidation at a temperature of between about 800° to 1000° C. for between about 10 to 50 minutes.

7. The method of claim 1, wherein said second conductive layer is formed of doped polycrystalline silicon to a thickness of between about 1000 to 5000 Angstroms.

8. The method of claim 1, wherein active regions are formed by ion implanting with arsenic AS75 at a dose of between about 1 E 15 to 8 E 15 atoms/cm.$^2$ and an energy of between about 40 to 100 KeV.

9. The method of claim 1 wherein said portion of said tunnel oxide over which said floating gate extends has a horizontal distance from said first insulating layer of between about 0.2 to 0.8 micrometers.

* * * * *